United States Patent [19]

Coteus

[11] Patent Number: 5,565,816
[45] Date of Patent: Oct. 15, 1996

[54] CLOCK DISTRIBUTION NETWORK

[75] Inventor: Paul W. Coteus, Yorktown Heights, N.Y.

[73] Assignee: International Business Machines Corporation, Armonk, N.Y.

[21] Appl. No.: 516,735

[22] Filed: Aug. 18, 1995

[51] Int. Cl.⁶ .............................. H03L 7/07; H03L 7/18; H03K 3/00; H03K 5/13
[52] U.S. Cl. ................................ 331/2; 331/16; 331/18; 331/55; 327/147; 327/153; 327/295; 327/297
[58] Field of Search .................................. 331/2, 16, 18, 331/25, 45, 57, 60, 74; 327/105, 107, 147–149, 153, 161, 293, 295, 297; 326/93

[56] References Cited

U.S. PATENT DOCUMENTS

| | | |
|---|---|---|
| 3,778,784 | 12/1973 | Karp et al. . |
| 4,293,932 | 10/1981 | McAdams . |
| 4,599,710 | 7/1986 | Pelgrom et al. . |
| 4,747,079 | 5/1988 | Yamaguchi . |
| 4,847,516 | 7/1989 | Fujita et al. ............................ 331/2 X |
| 4,868,522 | 9/1989 | Popat et al. ................................ 331/2 |
| 5,122,679 | 6/1992 | Ishii et al. .......................... 327/293 X |
| 5,122,693 | 6/1992 | Honda et al. . |
| 5,124,589 | 6/1992 | Shiomi et al. . |
| 5,184,027 | 2/1993 | Masuda et al. ..................... 327/153 X |
| 5,204,555 | 4/1993 | Graham et al. . |
| 5,265,049 | 11/1993 | Takasugi . |
| 5,317,202 | 5/1994 | Waizman . |
| 5,481,573 | 1/1996 | Jacobowitz et al. ................ 327/153 X |

FOREIGN PATENT DOCUMENTS 64-15820  1/1989  Japan .

*Primary Examiner*—David Mis
*Attorney, Agent, or Firm*—Scully, Scott, Murphy & Presser

[57] ABSTRACT

A clock distribution network for synchronously coupled electronic communication systems that includes a clock distribution device having a phase locked loop for synchronizing the external clock signals provided to each semiconductive device with each other. The clock distribution device distributes a low speed clock to a large number of clocked semiconductor devices where those devices then internally generate high speed clocks in phase with the low speed clock. The low speed clocks are phase shifted with respect to each other to reduce radiated energy. The ratio of internal to external clock speed is also communicated to each chip so that the chips can be programmed to operate with a variety of external clock speeds. The phase shifting of the external clock to different chips is provided so that the chips can still communicate synchronously at the high speed internal clock.

12 Claims, 3 Drawing Sheets

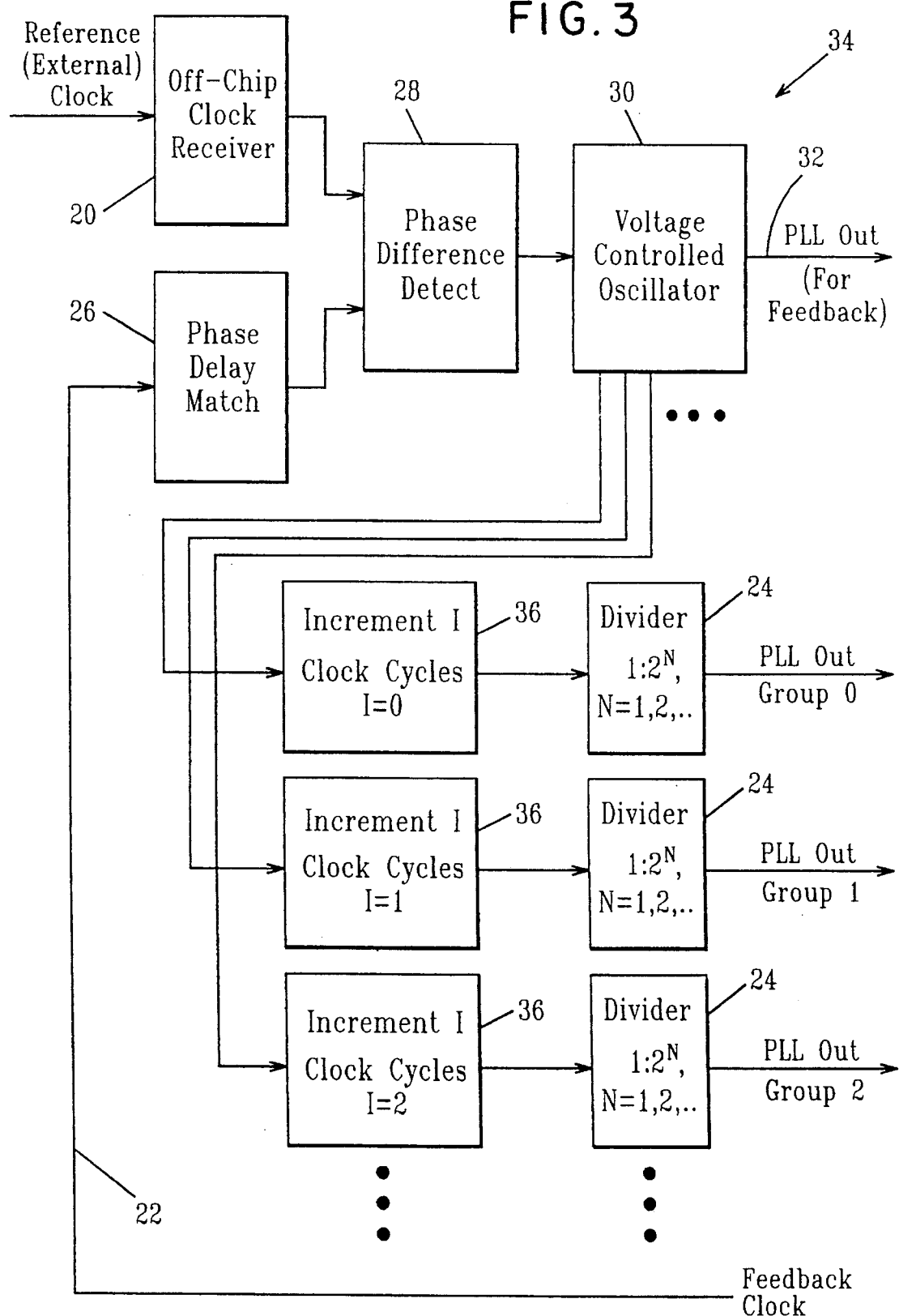

CLOCK DISTRIBUTION NETWORK

BACKGROUND OF THE INVENTION

1. Field of the Invention

The present invention relates to the field of generating clock signals for semiconductor devices, and in particular, to distributing a reference clock signal to a large number of devices.

2. Discussion of the Prior Art

Modern high speed electronic systems require a number of semiconductor chips to communicate in time with a high speed clock. Clock distribution then becomes a serious engineering concern. A high speed clock, operating at the frequency of the data communication, must be delivered to each device. In the case of a synchronous memory base system, this can be thousands of devices. At present, 100 MHz clock rates, clock distribution requires considerable power, generates a large noise pulse due to the large number of common switching devices and radiates large amounts of energy which may cause radio interference.

U.S. Pat. No. 5,122,693 is directed to a clock distribution system which uses a separate power supply to power an internal clock driver on a semiconductor logic device.

In addition, at 100 MHz clock rates, the problem of clock distribution exists also within the chip being clocked. As the clock, sampled at the chip's clock input, is distributed throughout the chip, the delays are encountered and the clock may arrive at different parts of the chip at different times, and in any event, considerably later than the time it was first sampled. The problem of clock redistribution within the chip can be alleviated with some degree through the use of a feedback loop.

U.S. Pat. No. 5,204,555 and Japanese reference 64-15820 disclose such feedback loops. In this technique, a regenerated clock is compared to a reference clock and a correction is applied to the regenerated clock so that it has the same phase as the reference clock. To use this technique in a chip, a regenerated clock can be derived from a reference clock with the correction being derived by comparing the regenerated clock to the reference clock. The feedback of the regenerated clock to the clock reference is achieved with a phase locked loop. It is possible in this system to have the frequency of the reference clock larger or smaller than the frequency of the regenerated clock.

There is a need, therefore, for a system for distributing an external clock signal to a large number of devices that are communicating together.

SUMMARY OF THE INVENTION

The present invention is directed to a clock distribution network for use in a tightly coupled synchronous electronic communication system. The clock distribution network of the present invention comprises a low frequency distributed and skewed clock tree which synchronizes on chip high frequency clock regenerators. The clock regenerators have both a frequency multiplication function which is programmable and a phase locking function.

More particularly, according to the present invention, a clock distribution network comprises a plurality of semiconductor devices each of which has a means for receiving an external clock signal at frequency h and a means for generating an internal clock signal at frequency f in phase with the external clock signal. The clock regeneration can be implemented by a phase locked loop circuit on each semiconductor device. A control unit provides control signals to each of the semiconductor devices in synchronous with the internal clock signals. A clock distribution device provides the external clock signals at frequency h to each of the semiconductor devices which synchronizes the external clock signals provided to each device with each other. The clock distribution device also includes means for shifting the phase of the clock signals by one or more clock periods 1/f. The phase shifting means could be introduced onto a phase locked loop network provided on the clock distribution device.

The clock distribution network of the present invention distributes a low speed clock (at frequency h) to a large number of clocked semiconductor devices where the devices then internally regenerate high speed clocks (at frequency f) phase aligned to the low speed clocks. In addition, the low speed clocks are phase shifted with respect to each other to reduce the amount of radiated energy. Moreover, in a further embodiment, the ratio of internal to external clock speed is communicated to each chip so that it can be programmed to operate with a variety of external clock speeds. Moreover, the phase shifting of the external clock to different chips is also provided so that the chips can still communicate synchronously at the high speed internal clock.

BRIEF DESCRIPTION OF THE DRAWINGS

FIG. 3 is a block diagram of a phase locked loop system in the clock distribution chip shown in FIG. 1.

DETAILED DESCRIPTION OF THE INVENTION

Figure 1:
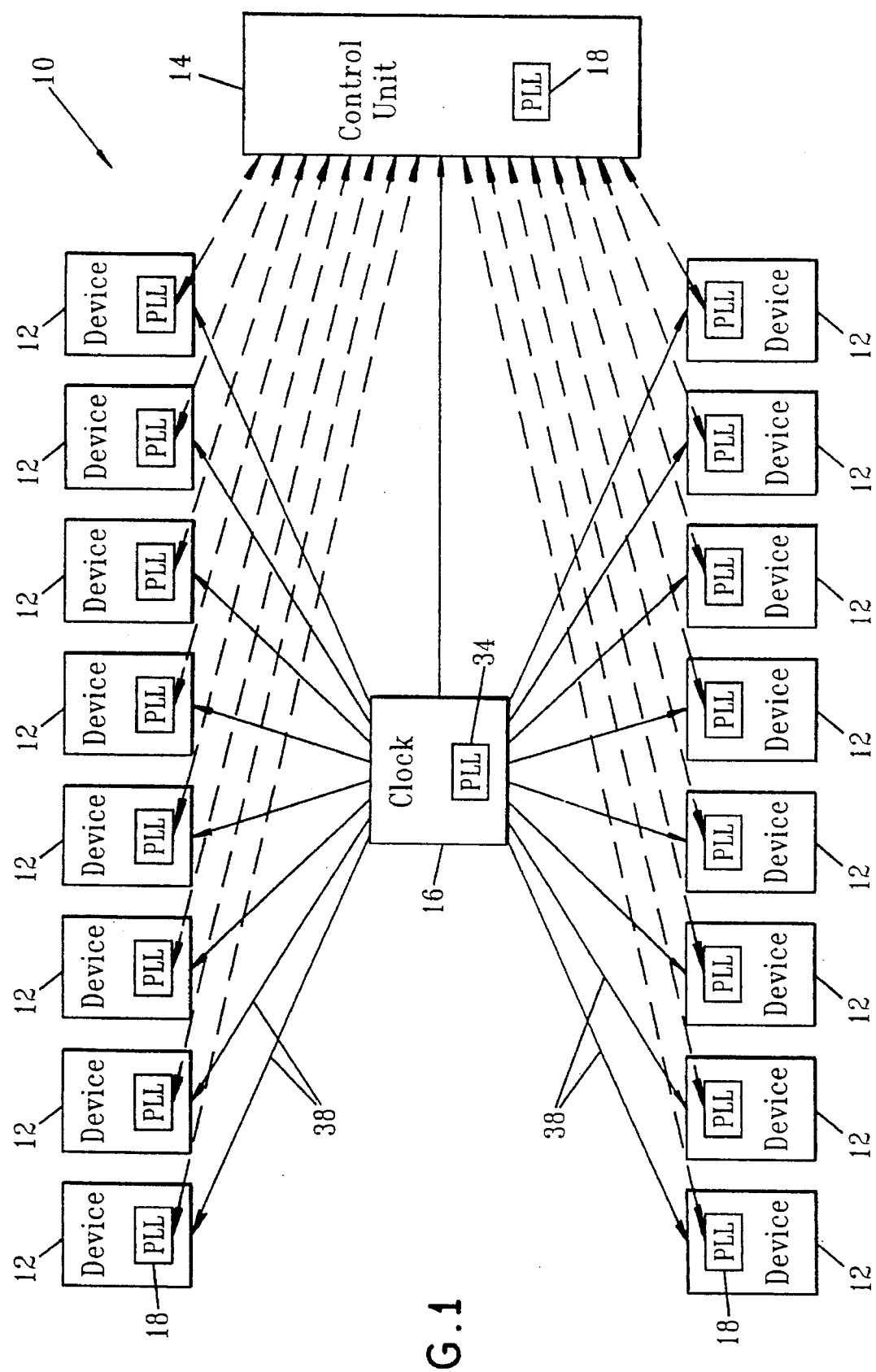
FIG. 1 is a schematic block diagram of the clock distribution network of the preset invention.

Turning now to the figures, FIG. 1 shows the clock distribution network 10 of the present invention. The network 10 is comprised of a plurality of semiconductor devices 12 that are coupled to a control unit 14 and a clock distribution unit 16. Each of the semiconductor devices 12 and control unit 14 include a means for synchronizing signals transmitted back and forth between each other. An example of one such circuit is a phase locked loop circuit 18 such as the one shown in FIG. 2.

Synchronous communication between the semiconductive devices 12, and control unit 14 can be provided in part by having phase locked loop circuit in each with a frequency multiplier that has the same multiplier factor.

Figure 2:
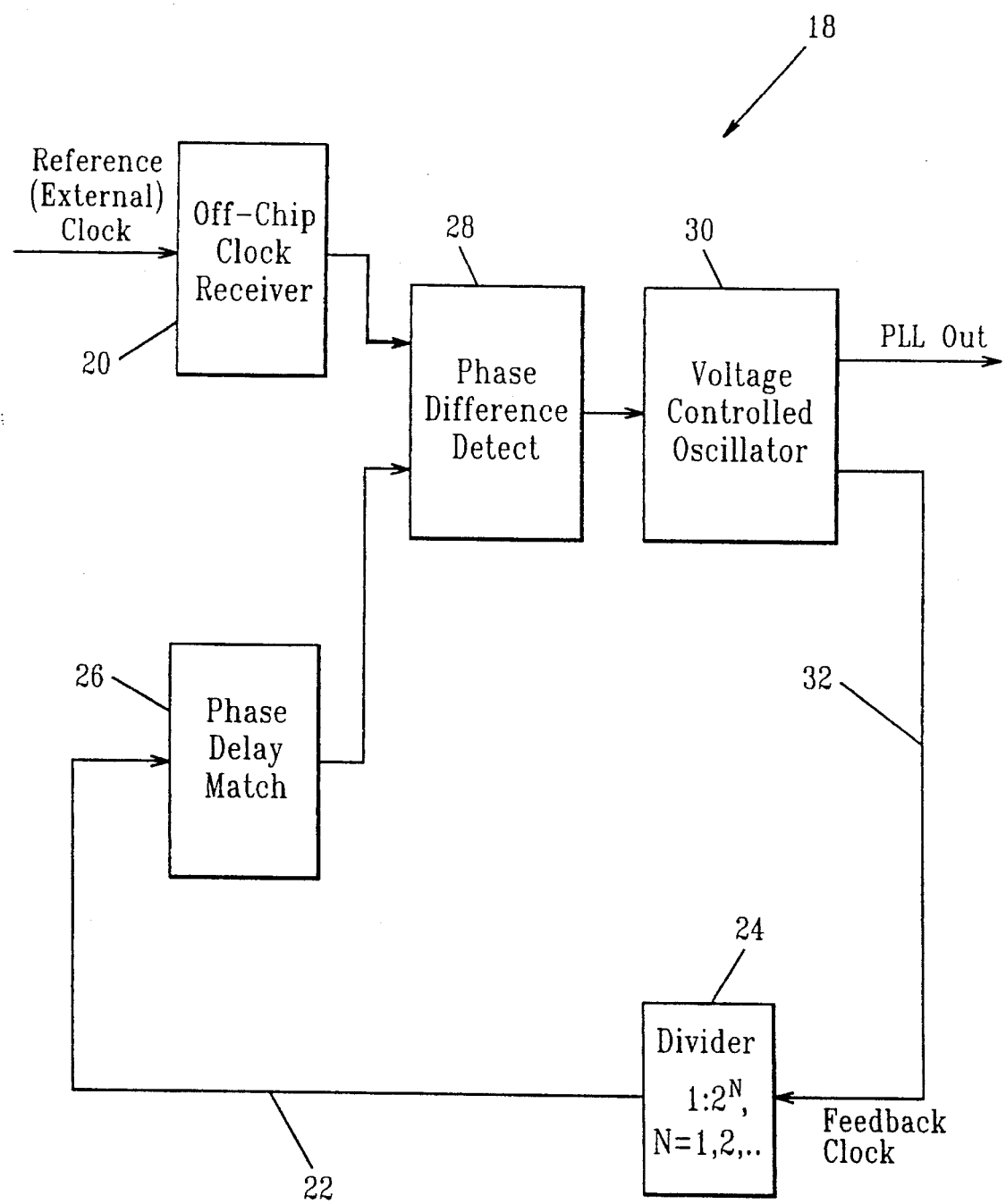
FIG. 2 is a block diagram of a phase locked loop system in each of the semiconductor devices in the clock distribution network shown in FIG. 1.

The phase locked loop circuit 18 in FIG. 2 includes an off chip clock receiver 20 that receives the reference external clock from clock distribution circuit 16. Feedback line 22 feeds back the output of the phase locked loop circuit 18 that has been divided by divider 24 into a phase delayed match circuit 26. Phase difference detect circuit 28 compares the phase of the external clock and of the feedback signal and detects a difference in the phase. The phase difference is inputted to voltage control oscillator 30 which outputs an internal clock signal PLL OUT that is multiplied in frequency. Internal clock signal PLL OUT is a higher frequency clock signal in which the ratio of the external reference clock to the internal clock is $1:2^N$ where N is equal to 1, 2, ... (the binary system is by example only as other integers are possible). The internal clock signal PLL OUT is then distributed internally within each device 12 or control unit 14 for controlling various functions therein. The high frequency internal clock signal is fed back through line 32 to divider 24 which divides the signal with a ratio of $1:2^N$ where N is equal to 1, 2, ... (again, other integers are possible).

Referring back to FIG. 1, each semiconductor device 12 therefore has a means for receiving an external clock signal of frequency h and a means for generating an internal clock signal of frequency f that is in phase with the external clock signal using the phase locked loop circuit 18. The control unit 14 which provides control signals to each of the semiconductor devices 12 utilizes a phase locked loop circuit 18 to synchronize said signals with the internal clock signals of each of the semiconductor devices.

The clock distribution device 16 provides the external clock signals of frequency h to each of the semiconductor devices 12. The clock distribution circuit 16 synchronizes the external clock signals provided to each semiconductor device with each other. The receiver circuit 20 receives a signal from an on chip clock source or another external clock source such as a crystal oscillator. The clock distribution device sends out clock signals at a frequency h which is less than frequency f and preferably much less. The external clock to the device 16 may be at a high frequency, such as f or higher. A phase locked loop within device 16 will divide the signal into a plurality of low frequency clock signals. The devices 12 with their phase locked loop circuits 18 are boosting the clock signal internally. In addition, the clock distribution device 16 includes means to phase shift the external clock signals with respect to each other by one or more internal clock periods so that the device 16 sends different semiconductor device clocks at different times. For example, if h:f were 1:16 and there were 16 clocks generated, at any one (internal) clock period, only one external clock would be active. In this way, all the internal clock frequencies of all the devices are still synchronized to each other, although at any one time there are fewer external clocks active. Any clock ratio is valid and any kind of clock phase shifting is possible. Communication to and from the chips with the control unit 14 is still synchronized, but the clock power, noise and radiated energy are reduced.

The phase shift within the clock distribution chip 16 can also be implemented in a phase locked loop circuit. One such circuit 34 is shown in block diagram form in FIG. 3. Like numerals for like elements of the circuit in FIG. 2 are used. A plurality of phase shift means 36 shifts phase of the signal from the VCO 30. Each shift means 36 shifts the phase by a different increment I, where I is equal to 0, 1, 2, ... Feedback line 32 is used to insure the phase allignment between the external clock and the lower frequency clocks. Dividers and multiplier circuits can be added to this line 32 if desired.

Therefore, in the clock distribution network 10 of the present invention, a low speed clock signal 38 is distributed to a large number of clocked semiconductor devices 12 where those devices then internally regenerate high speed clocks phase aligned to the low speed clock. The low speed clock signals 38 are also phase shifted with respect to each other to reduce the amount of radiated energy or electromagnetic interference. There will also be lower power consumption and lower switching noise.

It is also important to be able to change the ratio of external to internal clocks without redesigning the chips or clocks. In this embodiment, the semiconductor devices 12 and control unit 14 are memory devices. Memory devices are mass produced and used in a wide variety of memory systems and therefore it is necessary to be able to tell the memory devices what ratio of internal to external clocks is present in the system. The control unit is designed to provide a command signal to each of the semiconductor devices as representative of the ratio of f:h wherein the command signal is programmable to provide different ratios. In addition, the control unit can also be programmed to provide different ratios to different semiconductor devices. In a preferred embodiment, the ratio of f:h is synchronized with the phase shift of each external clock signal with respect to each other. In one preferred embodiment, the synchronization is provided by having a ratio of f:h of 1:M and each external clock signal is phase shifted by 1/M of a period with respect to each other.

In one specific example, the memory device 12 could be designed to default on the simplest ratio of, for example, 1:1. To program a range of, for example, 1:1 to 1:32 in the ratio of internal to external clock cycles, the lines containing the ratio (for example, address lines A0 through A5 of the memory devices) are held valid for 33 external clock cycles, but actually sampled on the first external clock cycle. Thus, the memory device must read the ratio on the first clock cycle, but except no other commands for the next 32 clock cycles. Subsequently, the phase locked loop waits to synchronize itself to the new ratio. If there are more commands to be programmed, they can be done now during this cycle delay. The clock ratio command is the only command that need be clocked externally. If this command is first, even before the phase locked loop has synchronized itself, then the 32 cycle delay is inconsequential. Alternatively, the phase locked loop is synchronized first at 1:1, then the real ratio is programmed with a 32 cycle delay and then the phase locked loop is resynchronized as required.

In a preferred embodiment, therefore, the clock distribution network of the present invention would provide a reference clock distributed to a plurality of devices communicating synchronously at an internal clock frequency either equal to or higher than the external clock by a factor of M, where $M=2^2$ (where N=1, 2, 3, ... ) and where different external clocks are shifted by N (N=1, 2, 3, ... ) internal clock cycles with respect to each other, and where the semiconductor devices are programmed to accept a range of $M=2^N$ (where N=0, 1, 2, 3, ... ) in the ratio 1:M of external to internal clocks.

The clock distribution network of the present invention is particularly useful in systems containing numerous synchronous memory devices such as DRAM's and SRAM's especially for clock speeds of 100 MHz or higher. It is also useful for any synchronous systems sensitive to power consumption such as portable or battery driven electronic devices.

In a further embodiment, pairs of external clock signals are phase shifted by one half of a period with respect to each other. Each leg of said pair of external clock signals is provided to, and phase aligned with, the same internal clock signal of two different semiconductor devices. The pairs of external clock signals will have the same frequency but exactly 180° out of phase with each other. In this system where the phase of pairs of external clocks are shifted by one half of the period there will be maximum cancellation of radiated energy. Thus a differential clock pair will be provided but with each leg of the pair going to a different chip. In this system the radiated energy from the sum of all clock lines would approach zero.

Although the invention has been described with respect to illustrative and preferred embodiments, the invention should not be limited except by the appended claims.

Having thus described our invention, what I claim as new, and desire to secure by Letters Patent is:

1. A clock distribution network comprising:
   a plurality of semiconductor devices, each of said semiconductor devices having means for receiving an external clock signal of frequency h and a means for generating an internal clock signal of frequency f in phase with said external clock signal;
   a control unit for providing control signals to each of said semiconductor devices, said control signals being synchronized with said internal clock signals;
   a clock distribution device for providing said external clock signals of frequency h to each of said semiconductor devices, said clock distribution device having means for shifting the phase of said external clock signals provided to each semiconductor device with respect to each other by one or more internal clock periods 1/f.

2. The network of claim 1 wherein said means for shifting the phase of said external clock signals is implemented in a phase locked loop circuit.

3. The network of claim 1 wherein each of said plurality of semiconductor devices has a phase locked loop circuit that receives said external clock signal at frequency h and generates said internal clock signal at frequency f.

4. The network of claim 1 wherein frequency h is less than frequency f.

5. The network of claim 1 wherein each of said semiconductor devices is a memory device and said control unit is a memory controller.

6. The network of claim 5 wherein said control signals provided to each of said semiconductor devices include a command signal representative of the ratio of f:h, said command signal being programmable to provide different ratios.

7. The network of claim 6 wherein said memory control unit provides signals representative of different ratios of f:h to different semiconductor devices.

8. The network of claim 6 wherein the ratio of f:h is synchronized with the phase shift of each external clock signal with respect to each other.

9. The network of claim 8 wherein the ratio of f:h is 1:M and each external clock signal is phase shifted by 1/M of a period with respect to each other.

10. The network of claim 8 wherein pairs of said external clock signals are phase shifted by ½ of a period with respect to each other.

11. The network of claim 10 wherein each leg of said pair of external clock signals is provided to, and phase aligned with, the same internal clock signal of different semiconductor devices.

12. The network of claim 1 wherein each of said semiconductor devices and said control unit include a phase locked loop and a frequency multiplier with the same multiplier factor.

* * * * *

UNITED STATES PATENT AND TRADEMARK OFFICE
CERTIFICATE OF CORRECTION

PATENT NO. : 5,565,816
DATED : October 15, 1996
INVENTOR(S) : Paul W. Coteus

It is certified that error appears in the above-indentified patent and that said Letters Patent is hereby corrected as shown below:

Column 4, line 39: " $M=2^2$ " should read -- $M=2^N$ --

Signed and Sealed this

Twenty-sixth Day of August, 1997

Attest:

BRUCE LEHMAN

Attesting Officer

Commissioner of Patents and Trademarks